United States Patent
Hayes et al.

(10) Patent No.: US 10,148,228 B2
(45) Date of Patent: Dec. 4, 2018

(54) RF POWER AMPLIFIER BIAS MODULATION WITH PROGRAMMABLE STAGES

(71) Applicant: NXP USA, Inc., Austin, TX (US)

(72) Inventors: Donald Vernon Hayes, Scottsdale, AZ (US); Joseph Staudinger, Gilbert, AZ (US); Abdulrhman M. S. Ahmed, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/384,601

(22) Filed: Dec. 20, 2016

(65) Prior Publication Data

US 2018/0175800 A1    Jun. 21, 2018

(51) Int. Cl.
*H03F 1/02*     (2006.01)
*H03F 3/195*   (2006.01)
(Continued)

(52) U.S. Cl.
CPC ......... *H03F 1/0288* (2013.01); *H03F 1/0266* (2013.01); *H03F 3/195* (2013.01);
(Continued)

(58) Field of Classification Search
USPC .................. 330/295, 124 R, 84, 286, 53–54
See application file for complete search history.

(56) References Cited

U.S. PATENT DOCUMENTS 8,604,881 B2   12/2013   Sankalp et al.
8,818,305 B1    8/2014   Schwent et al.
(Continued)

FOREIGN PATENT DOCUMENTS

EP   1264395 B1    9/2003
EP   2383884 A1   11/2011
JP   2007-053540 A   3/2007

OTHER PUBLICATIONS

Modi et al., "Efficiency Improvement of Doherty Power Amplifiers using Supply Switching and Gate Bias Modulation", Wireless and Microwave Technology Conference (WAMICON), 2014 IEEE 15th Annual, pp. 1-5.

*Primary Examiner* — Hieu Nguyen
(74) *Attorney, Agent, or Firm* — Sherry W. Schumm (57) ABSTRACT

A Doherty amplifier is able to enhance efficiency in low-power and high-power RF communication states by enabling carrier and peaking amplifiers as required, and controlling bias modulation, depending on traffic loading levels in each of a set of consecutive communications timeslots. For example, if, in a low-power state, traffic loading levels do not exceed a relatively lower threshold in a communications timeslot, carrier amplifiers are selectively enabled as needed, peaking amplifiers are not enabled, and carrier amplifier bias levels are kept substantially constant. If, in an intermediate-power state, the lower threshold is exceeded but a relatively higher threshold is not exceeded, all carrier amplifiers are enabled, peaking amplifiers are selectively enabled, and bias levels are kept substantially constant. If, in a high-power state, the higher threshold is exceeded, all carrier and peaking amplifiers can be enabled, and the peaking amplifier bias tracks the RF envelope of the received RF signal.

21 Claims, 6 Drawing Sheets

(51) Int. Cl.
   *H03F 3/24*       (2006.01)
   *H03F 3/68*       (2006.01)
(52) U.S. Cl.
   CPC ....... *H03F 3/245* (2013.01); *H03F 2200/102* (2013.01); *H03F 2200/105* (2013.01); *H03F 2200/336* (2013.01); *H03F 2200/451* (2013.01); *H03F 2200/555* (2013.01); *H03F 2203/21103* (2013.01); *H03F 2203/21106* (2013.01); *H03F 2203/21139* (2013.01)

(56) References Cited

U.S. PATENT DOCUMENTS

| | | |
|---|---|---|
| 9,071,202 B2 * | 6/2015 | Racey .................. H03F 1/0266 |
| 2004/0174212 A1 | 9/2004 | Kim |
| 2016/0142013 A1 | 5/2016 | Wang |

* cited by examiner

RF POWER AMPLIFIER BIAS MODULATION WITH PROGRAMMABLE STAGES

BACKGROUND

Field of Use

The present disclosure relates generally to radio frequency (RF) power amplifiers, and more specifically, to Doherty amplifiers that modulate bias based on traffic loading levels.

Description of the Related Art

Amplifiers, which increase signal power, can be used, for example, to convert low-power radio frequency (RF) signals into higher-power RF signals for driving the antenna of a transmitter. High gain, high linearity, stability, and a high level of efficiency are characteristics of an ideal amplifier. Recently, Doherty power amplifier architectures have been the focus of attention not only for base transceiver stations (BTSs), but also for mobile terminals because of the architecture's high power-added efficiency. A Doherty power amplifier includes two or more amplifiers: at least one "carrier" amplifier and at least one "peaking" amplifier. These amplifiers can be connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

In wireless communication systems, which often employ power amplifiers to increase the power of a high frequency signal, a power amplifier is usually the last amplifier in a transmission chain (i.e., the output stage). In general, conventional high frequency power amplifiers operate at maximum power efficiency when transmitting at maximum output power, which is experienced at high traffic loading levels. Power efficiency tends to decrease as output power decreases. Traffic loading levels (i.e., the number of users communicating at any one time) in wireless communications systems can vary greatly depending on, for example, time of day. A substantial proportion of the time, a system may be experiencing low traffic loading levels. What is needed is a power amplifier able to achieve higher efficiency at higher traffic loading levels as well as lower traffic loading levels.

BRIEF DESCRIPTION OF THE DRAWINGS

The present disclosure is illustrated by way of examples and embodiments and is not limited by the accompanying figures. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

The following detailed description is exemplary in nature and is not intended to limit the invention or the application and uses of the same. Furthermore, there is no intention to be bound by any expressed or implied theory presented in the preceding technical field, background, or the following detailed description.

The present embodiments may be used to improve the performance of power amplifiers in RF communications systems. The power amplifiers may be used in base station power amplifiers, cell phones, other portable devices, and other apparatus or devices dependent upon semiconductor packages, where low cost, low weight, and small volume may be desired. The embodiments described herein may enhance efficiency during times of lower traffic loading. Because many communications systems can experience low traffic loading more often than peak traffic loading, gains in efficiency in lower power situations can achieve significant gains in efficiency.

Figure 1:
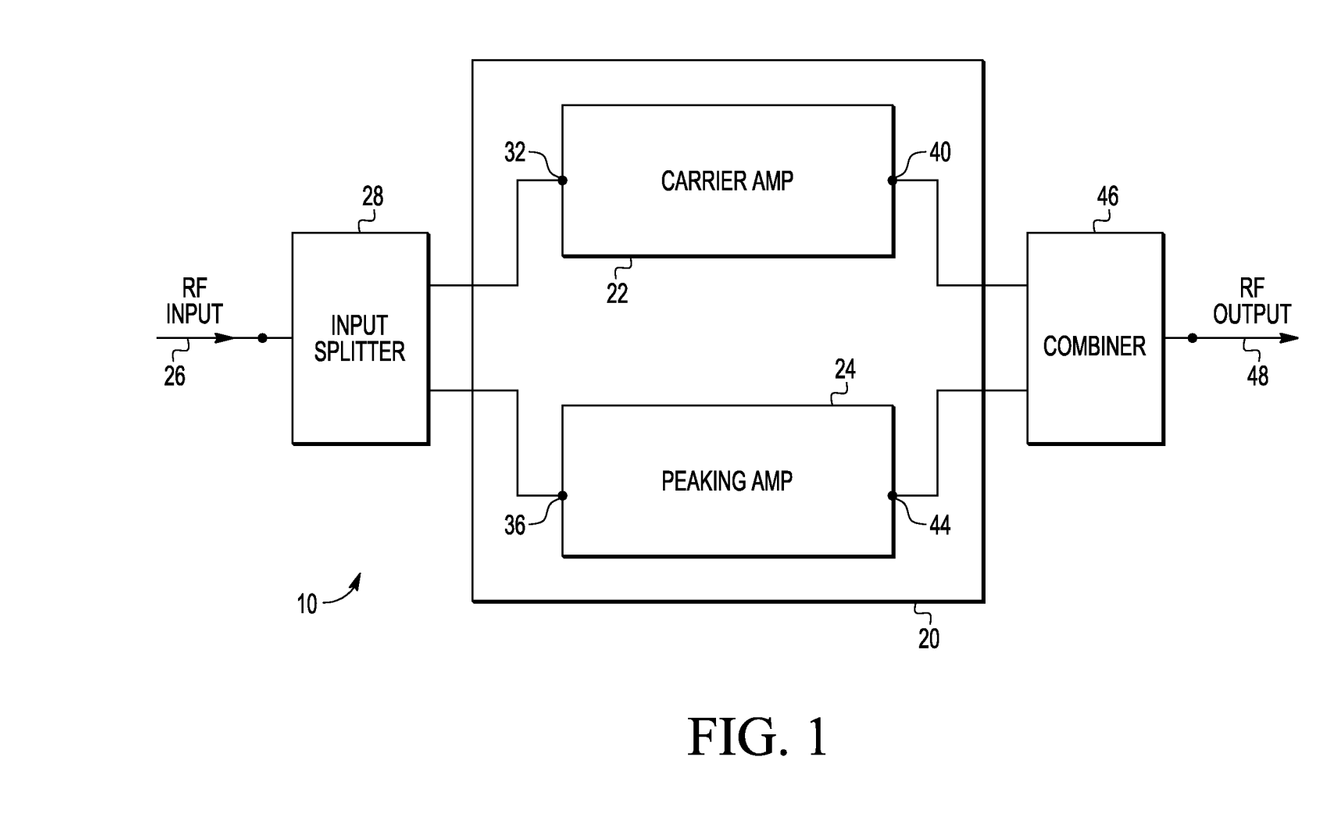
FIG. 1 is a block diagram of an exemplary embodiment of a Doherty power amplifier with a carrier amplifier and a peaking amplifier.

Features of exemplary Doherty amplifier architectures are represented in FIG. 1, which shows a simplified block diagram of a Doherty power amplifier 10 that includes a carrier amplifier 22 and a peaking amplifier 24 connected in parallel. The carrier amplifier 22 and peaking amplifier 24 may be contained in a semiconductor package 20. A high frequency RF input signal 26 is divided into two signals by an input splitter 28, which may apply a phase delay to one or both of the signals (e.g., resulting in a 90 degree phase difference between the two signals). The input splitter 28 may be coupled to a printed circuit board (not illustrated) or other substrate to which the semiconductor package 20 is coupled, or the input splitter 28 may be included within the semiconductor package 20. One of the resulting input signals is applied to a first input 32 of the carrier amplifier 22, and the other input signal is applied to a second input 36 of the peaking amplifier 24. The carrier amplifier 22 produces a first output signal at a first output 40 and the peaking amplifier 24 produces a second output signal at a second output 44. In a Doherty configuration, the first input 32 and the first output 40 may constitute a gate terminal and a drain terminal of the carrier amplifier 22, respectively; and the second input 36 and the second output 44 may constitute a gate terminal and a drain terminal of the peaking amplifier 24, respectively. The first and second output signals 40, 44 are combined through an output combiner 46 to produce a combined high frequency RF output signal 48. The output combiner 46 may be coupled to a printed circuit board (not illustrated) or other substrate to which the semiconductor package 20 is coupled, or the output combiner 46 may be included within the semiconductor package 20. Those skilled in the art will recognize that a Doherty power amplifier semiconductor package typically includes additional electronic devices and circuitry not shown herein for simplicity of illustration. In addition, a Doherty power amplifier may include more than two signal paths, in other embodiments. For example, a Doherty power amplifier may include one carrier amplifier and multiple peaking amplifiers, or multiple carrier and peaking amplifiers, in different configurations.

In certain applications, the carrier amplifier 22 may be configured to be active for an entire range of output powers of Doherty power amplifier 10. Peaking amplifier 24 may be configured to turn on only when the carrier amplifier 22 saturates. Output combiner 46, operating to combine the high frequency first output signal from the carrier amplifier 22 with the high frequency second output signal from peaking amplifier 24, may add a ninety degree lag to the output signal from the carrier amplifier 22 or the peaking amplifier 24 in order to compensate for the phase delay added by the input splitter to the signal provided to either the peaking amplifier 24 or the carrier amplifier. The phase of the signal provided to peaking amplifier 24 is typically designed to lag that of the carrier amplifier 22 by ninety degrees so that the two output signals add in-phase when the output signals are combined at the output of output combiner 46 to form combined output signal 48. Alternatively, the phase of the signal provided to the carrier amplifier 22 may be designed to lag that of the peaking amplifier 24 (e.g., in an inverted Doherty amplifier configuration).

Those skilled in the art will recognize that the carrier amplifier 22 and peaking amplifier 24 may include additional electronic components not shown herein for simplicity of illustration. In the circuit represented in FIG. 1, each of the carrier amplifier 22 and peaking amplifier 24 may include a number of active and passive electrical elements. For example, the carrier amplifier 22 may include a first input impedance matching network (e.g., including one or more capacitors and inductors) that couples the first input 32 to a control terminal of a first transistor (e.g., an LDMOS or other type of transistor). The first transistor could apply the appropriate amplification to the first input signal received at that input. An output of the first transistor can be connected to a first output impedance matching network (e.g., also including one or more capacitors and inductors), which in turn is connected to output 40. The first impedance matching networks can operate to condition the first signal that is amplified by the first transistor. Similarly, the peaking amplifier 24 can include a second input impedance matching network (e.g., including one or more capacitors and inductors) coupling the second input 36 to the control terminal of a second transistor (e.g., an LDMOS or other type of transistor). The second transistor can then apply the appropriate amplification to the second input signal received at the second input. An output of the second transistor can be connected to a second output impedance matching network (e.g., including one or more capacitors and inductors), which in turn is connected to output 44. The second impedance matching networks can operate to condition the second signal that is amplified by the second transistor.

Figure 2:
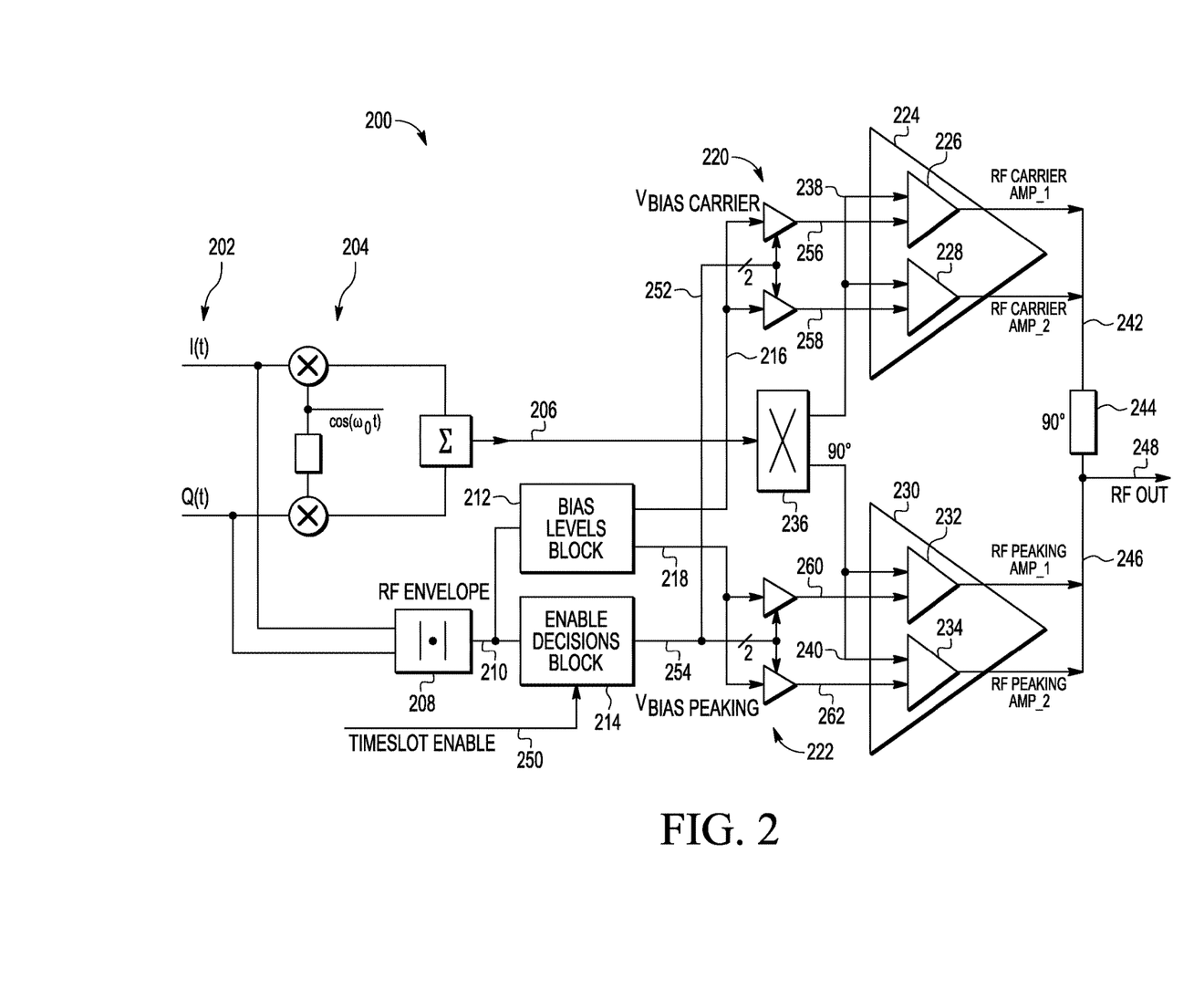
FIG. 2 is a block diagram of an exemplary embodiment of a Doherty amplifier with bias modulation for carrier and peaking amplifiers.

Referring to FIG. 2, exemplary power amplifier device 200 receives an RF input signal 202 (represented by I(t) and Q(t)), analyzes it using front end signal analyzer 204, and outputs the RF signal 206 to be amplified. The RF input signal 202 is also received at RF envelope detector block 208, which determines the magnitude of the RF input signal (by, for example, taking the square root of the sum of $I^2$ and $Q^2$). The RF envelope detector block 208 outputs an RF envelope signal 210, which represents the magnitude of the envelope of the RF input signal. The RF envelope signal 210 is fed to a bias levels block 212 and to an enable decisions block 214. The bias levels block 212 outputs one or more carrier bias control signals 216 and one or more peaking bias control signals 218, which are fed to carrier gate bias modulation (GBM) buffers 220 and peaking GBM buffers 222, respectively.

The amplifier device 200 includes a carrier amplifier block 224, which is illustrated as having first and second carrier amplifiers 226 and 228 (although one, or more than two, amplifiers may be used in different applications). Also included is a peaking amplifier block 230, which includes first and second peaking amplifiers 232 and 234, although the peaking amplifier block 230 can similarly include one or any number of amplifiers deemed suitable. The RF signal 206 is received at a splitter block 236, which outputs a carrier input signal 238 to be amplified by the carrier amplifier block 224. The splitter block 236 also outputs a peaking input signal 240, which is phase-shifted by 90 degrees relative to the RF signal 206, to be amplified by the peaking amplifier block 230. The carrier amplifier block 224 outputs carrier-amplified signal 242, which is phase shifted 90 degrees by phase shifter 244. The peaking amplifier block 230 outputs peaking-amplified signal 246, which is combined by a combiner (not shown) with the phase-shifted carrier-amplifier signal to obtain RF output signal 248.

It is noted that buffers/buffer amplifiers 220 and 222 can provide an interface through which a low drive input signal is conditioned to a higher drive signal that can then be applied to the amplifiers of amplifier blocks 224 and 230. This may be particularly useful when the amplifiers 224 and 230 exhibit a high capacitive input impedance, and buffer amplifiers 220 and 222 can be used to account for the high capacitive loading. Additionally, placing the buffer amplifiers 220 and 222 in a package in close proximity to RF transistors can reduce or eliminate deleterious effects on performance resulting from long interconnecting lines and parasitics.

Inhibiting and enabling amplifiers as needed (which tends to enhance efficiency), a timeslot enable signal 250 is input to the enable decisions block 214, which outputs a carrier enable signal 252 and a peaking enable signal 254. The carrier and peaking enable signals 252, 254 are configured to control whether or not the carrier and peaking preamplifiers 220, 222 supply the bias signals 216, 218 to the carrier and peaking amplifier blocks 224, 230. The carrier preamplifier 220 outputs carrier bias signals 256, 258 to first and second carrier amplifiers 226, 228, respectively. Similarly, the peaking preamplifier 222 outputs peaking bias signals 260, 262 to first and second peaking amplifiers 232, 234, respectively. Controlling bias signals allows the selective activation of amplifiers on an as-needed basis, and the biasing of amplifiers up to their desired class of operation (which is often class A or A/B for carrier amplifiers, and class C for peaking amplifiers) to achieve the optimal mode of operation for the specific amplifiers. It is noted that the block diagram of FIG. 2 represents only one implementation of an exemplary Doherty amplifier, and many different implementations that vary from the illustration are possible.

Figure 3:
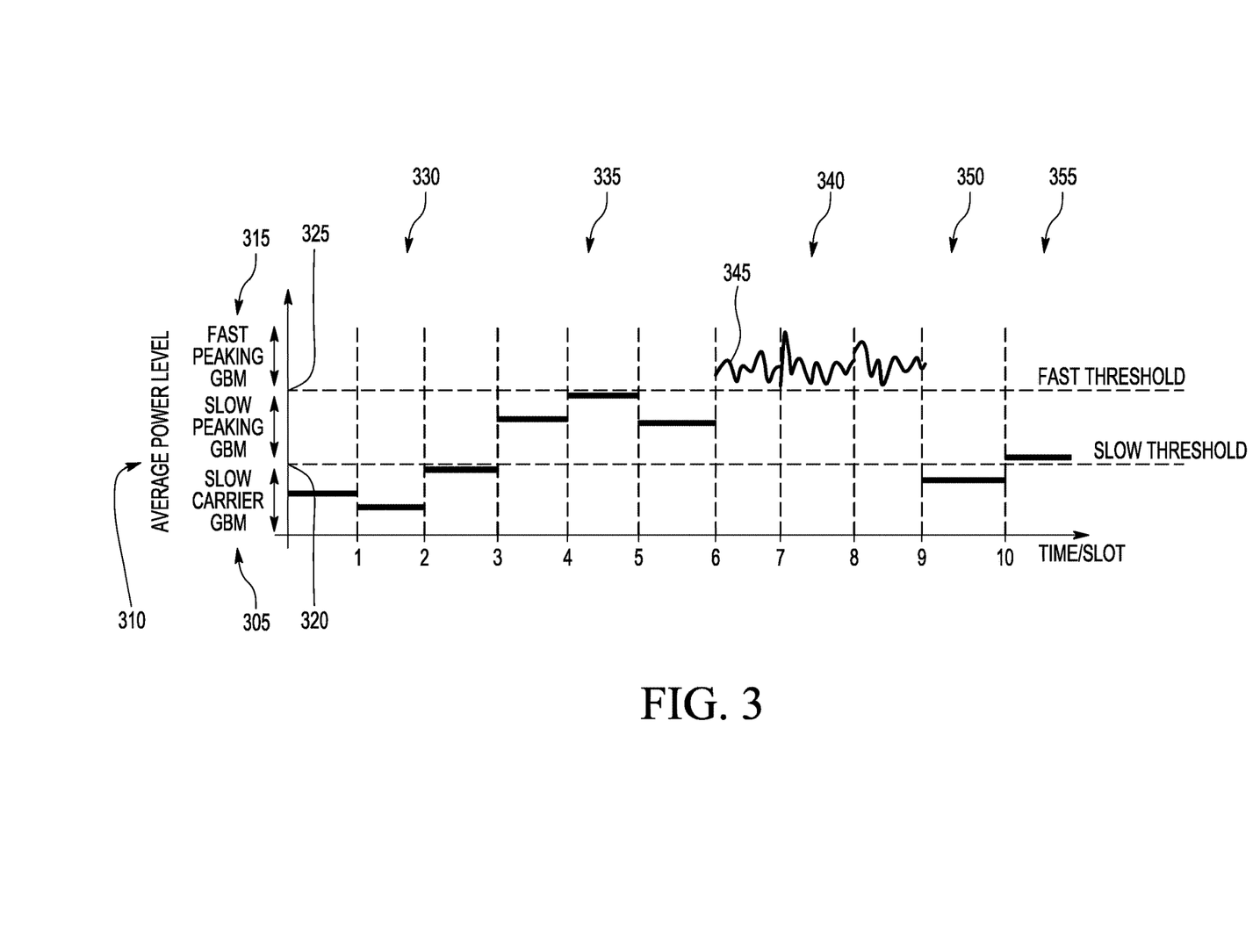
FIG. 3 is a representation of bias voltage at different average power levels (corresponding with different levels of traffic loading levels) during a series of consecutive communications timeslots.

Exemplary amplifier devices like the one represented in FIG. 2, can be controlled to enhance efficiency at various traffic loading levels. Referring to FIG. 3, in exemplary embodiments, the device can be controlled so as to achieve three states of operation, which will be referred to as slow carrier gate bias modulation ("GBM") 305, slow peaking GBM 310, and fast peaking GBM 315. In FIG. 3, the horizontal axis represents time, which is divided into a plurality of sequential timeslots associated with a communications protocol being implemented by the system. The vertical axis represents average power level (e.g., in watts), where power level thresholds for the RF envelope signal (e.g., signal 210, FIG. 2) are indicated with horizontal dashed lines, and level of bias signals (e.g., bias signals 256, 258, 260, 262, FIG. 2) are indicated with horizontal solid lines. The system (e.g., by bias levels block 212, FIG. 2) dynamically determines the magnitude of the RF envelope signal (e.g., signal 210, FIG. 2). If an attribute of the power level (such as average power) of the RF envelope signal is below a slow threshold 320, the amplifier device 200 operates in the slow carrier GBM 305 state; this may result when traffic loading levels are relatively low, which can be common, for example, during the night when fewer people are awake (and thus fewer people are communicating using RF communications providers). If the attribute of the power level of the RF envelope signal exceeds the slow threshold 320 but does not exceed a fast threshold 325, traffic loading is at an intermediate level, and the amplifier device is operated in the slow peaking GBM state 310. If the attribute of the power level of the RF envelope signal exceeds the fast threshold 325, which is higher than the slow threshold 320, traffic loading is at a relatively high level, and the amplifier device is operated in the fast peaking GBM state 315; this may occur commonly, for example, during a sports game or other gathering of users in the same communications service area.

In the slow carrier GBM state 305, the GBM buffers for the one or more carrier amplifiers (e.g., buffers 220, FIG. 2) are enabled (e.g., by enable decisions block 214), while the GBM buffers for the one or more peaking amplifiers (e.g., buffers 222) are disabled (e.g., by enable decisions block 214). Further, the magnitudes of the bias signal(s) (e.g., bias signals 256, 258 produced by GBM buffers 220, FIG. 2) are controlled (e.g., by bias levels block 212, FIG. 2) as described below. In FIG. 3, amplifier device 200 is operating in a slow carrier GBM state 305 during the first three communications timeslots 330. As represented by the horizontal lines in timeslots 330 (i.e., the first, second, and third timeslots), the bias signals to the carrier amplifier(s) are maintained at a substantially constant level. Bias signal modulation consumes power, and because it is often not needed when traffic loading is low, maintaining a constant bias signal can enhance efficiency. The magnitude(s) of the bias signal(s) to the carrier amplifier(s) can be modified between timeslots, as shown in FIG. 3, but during each timeslot, the bias signal(s) are not modulated. The number of carrier amplifiers operating in each communications timeslot can be selectively varied—i.e., carrier amplifiers can be enabled or disabled as needed—between timeslots in the slow carrier GBM state 305.

When power levels of the RF envelope signal exceed the slow threshold 320 but not the fast threshold 325, the amplifier device operates in the slow peaking GBM state 310. In the slow peaking GBM state 310, the GBM buffers for the one or more carrier amplifiers (e.g., buffers 220, FIG. 2) are enabled (e.g., by enable decisions block 214), and the GBM buffers for one or more of the peaking amplifiers (e.g., buffers 222) also are enabled (e.g., by enable decisions block 214). Further, the magnitudes of the bias signal(s) (e.g., bias signals 256, 258, 260, 262 produced by GBM buffers 220, 222, FIG. 2) are controlled (e.g., by bias levels block 212, FIG. 2) as described below. In FIG. 3, amplifier device 200 is operating in a slow peaking GBM state 310 during the next three communications timeslots 335 (i.e., the fourth, fifth, and sixth timeslots). While in the slow peaking GBM state 310, the bias signals to the carrier and peaking amplifiers are maintained at substantially constant levels as represented by the horizontal lines in timeslots 335 (the fourth, fifth, and sixth timeslots). Although the magnitudes of the gate bias signals can be modified between timeslots, the bias signals are not modulated for the duration of each of these three timeslots. Peaking amplifiers can be enabled or disabled as needed between timeslots in the slow peaking GBM state 310. As with the slow carrier GBM state 305, the intermediate traffic loading levels associated with the slow peaking GBM state 310 do not necessarily require gate bias modulation, and thus maintaining constant bias signals can enhance efficiency in the slow peaking GBM state 310.

When the average power level of the RF envelope signal exceeds the fast threshold 325, which is higher than the slow threshold 320, the amplifier device 200 operates in a fast peaking GBM state 315. In FIG. 3, this occurs during communications timeslots 340 (i.e., the seventh, eight, and ninth timeslots). In the fast peaking GBM state 315, the GBM buffers for the one or more carrier amplifiers (e.g., buffers 220, FIG. 2) are enabled (e.g., by enable decisions block 214), and the GBM buffers for one or more of the peaking amplifiers (e.g., buffers 222) also are enabled (e.g., by enable decisions block 214). Further, the magnitudes of the bias signal(s) (e.g., bias signals 256, 258, 260, 262 produced by GBM buffers 220, 222, FIG. 2) are controlled (e.g., by bias levels block 212, FIG. 2) as described below. According to an embodiment, the bias signals can be actively modulated such that they track the RF envelope signal (e.g., the bias voltages are dynamically increased and decreased in synchronization with the magnitude of the RF envelope signal). Such modulation of the bias signal magnitudes is represented by signal trace 345. As illustrated, once power levels drop below the fast threshold 325 (corresponding with a drop in traffic loading levels), the amplifier device 200 can be returned to operate in the slow carrier GBM state 305 (e.g., during the tenth timeslot 350) or the slow peaking GBM state 310 (e.g., during the eleventh timeslot 355), during which time the bias signal(s) are again maintained at substantially constant levels within each timeslot. It is also noted that although the bias levels are referred to as "gate" bias signals, this is not intended to limit implementations to using field effect transistors (FETs) exclusively. Exemplary versions of the invention could, in various implementations, use other kinds of transistors, such as bipolar junction transistors (BJTs), in which the analogous terminal is referred to the base. In addition, the bias signal(s) also or alternatively could include drain bias signals.

Figure 4:
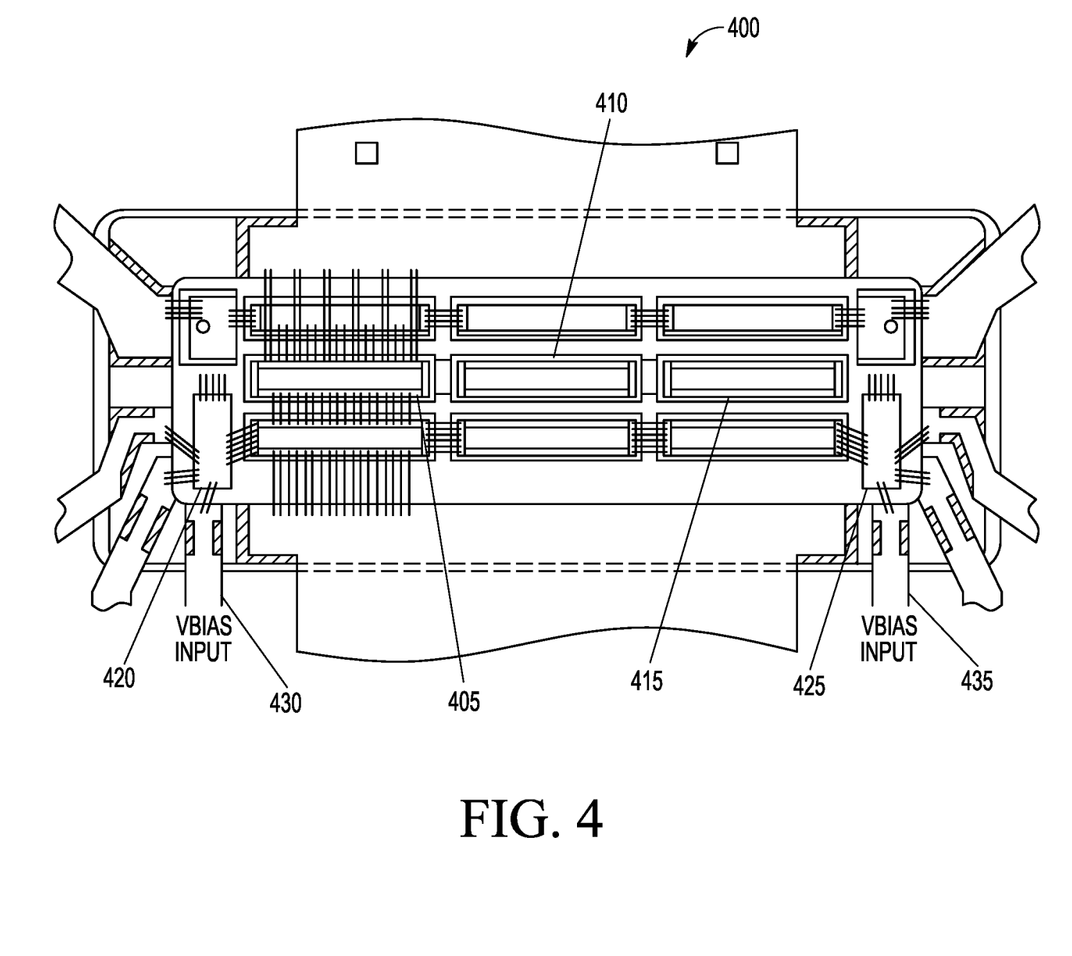
FIG. 4 is an exemplary embodiment of a semiconductor package with three amplifier stages and two gate bias modulation ("GBM") buffers.

Turning to FIG. 4, an exemplary packaged amplifier device 400 includes three peaking amplifier integrated circuits (ICs) 405, 410, 415 (e.g., power transistors). Similarly packaged amplifier devices may include one or more carrier amplifier ICs, or a combination of carrier and peaking ICs. Package 400 also includes GBM buffers 420, 425 (e.g., GBM buffers 220, 222, FIG. 2), which modulate the magnitudes of the bias signals provided to the peaking amplifiers

405, 410, 415. For example, one of the GBM buffers can be configured to control the bias signal applied to one of the peaking amplifiers, and the other GBM buffer can be configured to control the bias signals applied to the other two peaking amplifiers. By enabling (e.g., through signal 254 from enable decisions block 214, FIG. 2) the buffer that provides a bias signal to one peaking amplifier, the device 400 can be controlled to enable one peaking amplifier. By enabling (e.g., through signal 254 from enable decisions block 214, FIG. 2) the buffer that provides bias signals to two peaking amplifiers, the device can be controlled to enable two peaking amplifiers. By enabling both buffers 420, 425, the device can be controlled to enable all three peaking amplifiers. The GBM buffer 420 can receive an input control signal (e.g., signal 218 from bias levels block 212, FIG. 2) via voltage bias input lead 430, and the GBM buffer 425 can receive an input control signal (e.g., signal 218 from bias levels block 212, FIG. 2) via voltage bias input lead 435.

Figure 5:
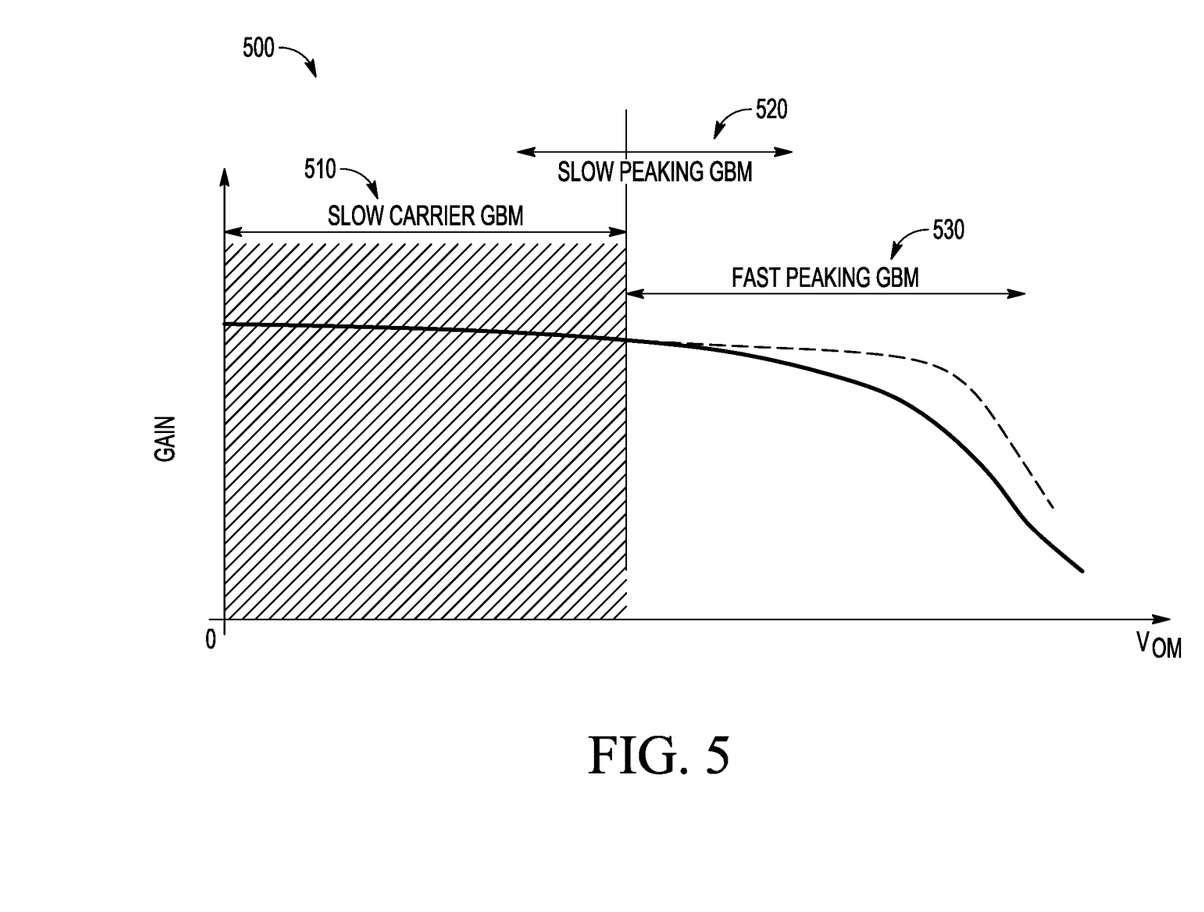
FIG. 5 illustrates the application of "slow" and "fast" GBM on carrier and peaking amplifiers under different traffic loading conditions, according to an embodiment.

The graph shown in FIG. 5 plots gain versus maximum output voltage (Vom). Under low traffic loading levels, power and voltage are low, and voltage excursion stays within region 510 (on the left side). The maximum voltage that can be handled is not approached. In this low-power range 510 (e.g., when traffic loading is low), slow GBM is implemented on the carrier power amplifier. In a mid-level power range 520 (e.g., in which traffic loading is at an intermediate level), slow GBM is applied to the bias signals for the carrier power amplifier and for one or more peaking power amplifiers. On the far-right range 530 (e.g., during the highest level of traffic loading conditions), fast peaking GBM is applied to the bias signals for the peaking power amplifier and for one or more peaking power amplifiers. In this example, in addition to efficiency improvement, gain has also been "flattened" as a result of "slow" and "fast" GBM. GBM processing may also be used to optimize, for example, harmonics, adjacent channel spectral attenuation, and other peaking amplifier characteristics.

Figure 6:
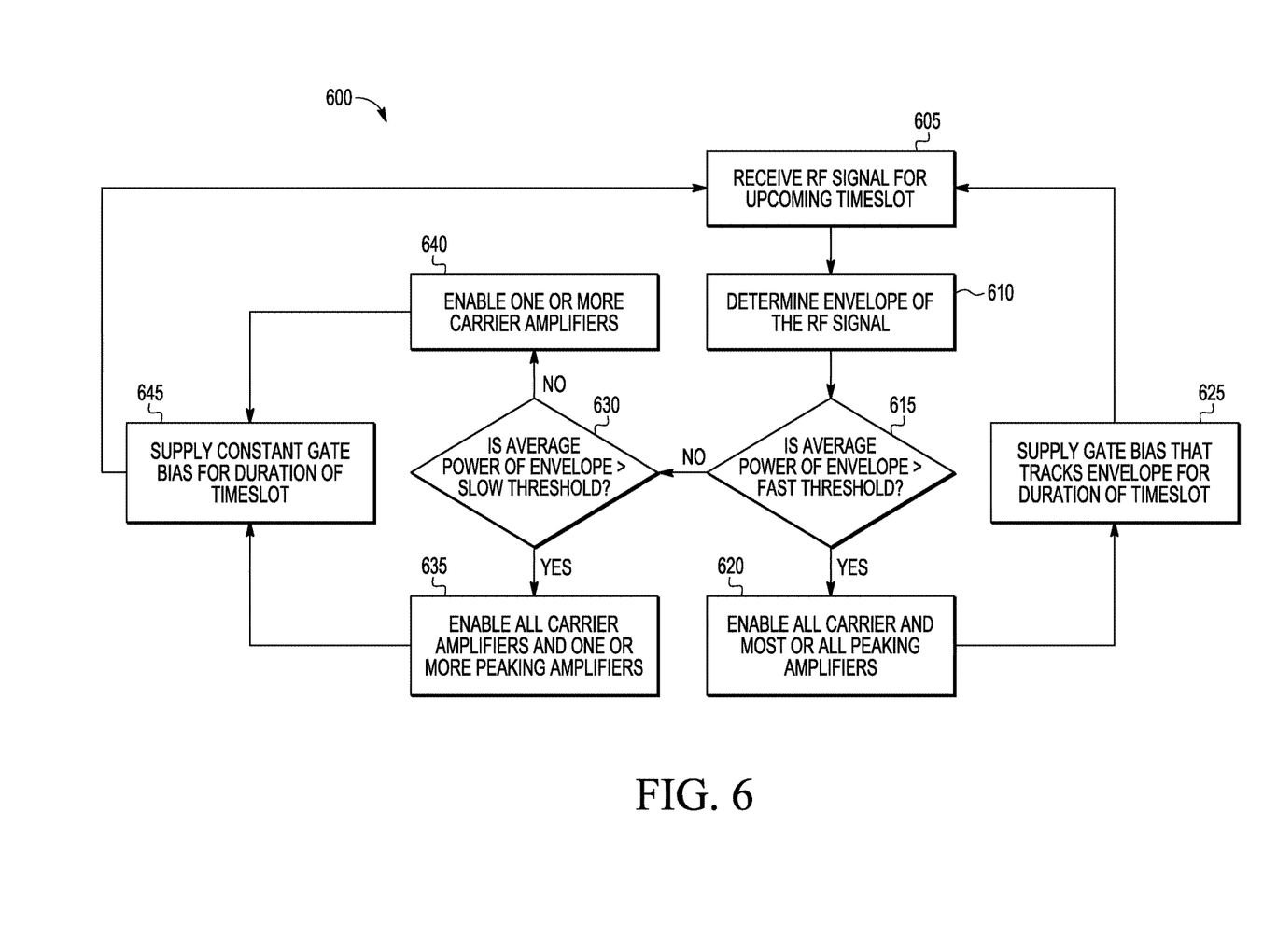
FIG. 6 provides a flowchart of an exemplary implementation of the multiple states in which an exemplary Doherty amplifier could be operated, according to an embodiment.

Referring to the exemplary process 600 in FIG. 6, a communications system receives an RF signal to be preprocessed and transmitted in an upcoming communications timeslot (605). A "controller" of the system may include, for example, an RF envelope detector block (e.g., block 208, FIG. 2), a bias levels block (e.g., block 212, FIG. 2), and an enable decisions block (e.g., block 214, FIG. 2). The "controller" may be centralized or distributed. The controller (e.g., RF envelope detector block 208) may determine an envelope of the RF signal (610) to help in evaluating the power levels of the RF signal. The average power level of the envelope (or other attribute of the RF signal) is compared (e.g., by enable decisions block 214) with a "fast" threshold (615), above which power levels are relatively high (e.g., due to high traffic loading levels). If the average power level does exceed the fast threshold, the controller (e.g., enable decisions block 214) can enable all carrier amplifiers, as well as a suitable number of peaking amplifiers (depending on power levels involved), which may be most or substantially all of the peaking amplifiers available (620). The number of peaking amplifiers to be enabled may be a preset number (such as all of them), or it may be based on ranges of traffic loading levels for each timeslot, with the number of enabled peaking amplifiers being directly proportional to traffic loading levels. The gate bias voltage supplied to the enabled amplifiers can be actively varied (e.g., by bias levels block 212) so as to track the envelope of the RF signal for the duration of the timeslot (625). This corresponds with the "fast peaking GBM" state discussed above. The system continues by receiving RF signals for subsequent timeslots (605).

If, on the other hand, the average power level of the envelope does not exceed the fast threshold, the controller (e.g., enable decisions block 214) compares the average power level to a slow threshold (630), which is lower than the fast threshold. If the average power level exceeds the slow threshold (e.g., when traffic loading levels are at an intermediate level), the controller (e.g., enable decisions block 214) may enable all carrier amplifiers, and one or more of the available peaking amplifiers as deemed suitable (635). This corresponds with the "slow peaking GBM" discussed above. As in the fast peaking GBM state, the number of peaking amplifiers enabled may be preset, or it may be based on power levels in the corresponding timeslot. If the average power level of the envelope does not exceed the slow threshold (e.g., correspond to relatively low traffic loading levels), one or more carrier amplifiers may be enabled (640), with no peaking amplifiers enabled. This corresponds with the "slow carrier GBM" state discussed above. The number of carrier amplifiers enabled may be preset, or it may be based on actual power/traffic loading levels. In both the slow peaking GBM and slow carrier GBM states, once the corresponding number of carrier and/or peaking amplifiers have been enabled, the gate bias voltage supplied to the power amplifiers is maintained (e.g., by bias levels block 212) at a substantially constant level (or their variation is at least limited to a certain percentage of a target level, such as within 10 percent of a target voltage) for the duration of the communications timeslot (645). The system continues as it receives RF signals for subsequent timeslots (605).

It is noted that although two thresholds have been discussed, alternative versions may operate with one or more than two thresholds. For example, in certain configurations, a single threshold (analogous to the fast threshold) may be used to determine whether bias signals should be actively modulated such that they track the RF envelope signal (when the single threshold is exceeded) for the duration of a communications timeslot, or if bias signals should be kept substantially constant (when the single threshold is not exceeded) for the duration of the communications timeslot. In such configurations, the controller can be configured to (for example) enable all amplifiers if the single threshold is exceeded, and to enable a certain proportion of amplifiers, such as all of the carrier amplifiers but none of the peaking amplifiers, or half (or other fraction) of all available amplifiers, when the single threshold is not exceeded.

In other versions, more than two thresholds can be implemented, such as first, second, and third thresholds, in which the third threshold may be higher than the second threshold which may be higher than the first threshold. In such configurations, the bias signal modulation and selection of amplifiers to be enabled can be varied as desired according to which thresholds are exceeded. For example, with respect to bias signal modulation, bias signals may be actively modulated only when the third (highest) threshold is exceeded, and kept substantially constant otherwise; or, bias signals may be actively modulated as long as the second (intermediate) threshold is exceeded, and kept substantially constant if the second threshold is not exceeded. With respect to enabling of amplifiers, the controller could be configured to (for example) enable a proportion (such as one, or half) of carrier amplifiers when the first threshold is not exceeded, enable all carrier amplifiers but no peaking amplifiers when the first threshold is exceeded but the second threshold is not exceeded, enable a proportion (such as one, or half) of peaking amplifiers when the second threshold is exceeded but the third threshold is not exceeded, and enable all carrier and peaking amplifiers when the third threshold is exceeded. Any variation or combination of the above bias signal modulation and amplifier enablement schemes could be implemented to suit the needs of different applications depending on such factors as traffic loading trends.

For the sake of brevity, conventional techniques related to Doherty amplifiers, load modulation, impedance matching, integrated circuit design and/or fabrication, transistor design and/or fabrication, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" and "coupled" mean that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

The terms "first," "second," "third," "fourth," and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have," and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "substantial" and "substantially" herein mean sufficient to accomplish the stated purpose in a practical manner and that minor imperfections, if any, are not significant for the stated purpose.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. An amplifier device, comprising:
    a radio frequency (RF) amplifier having an input configured to receive an RF input signal, a bias input configured to receive a bias voltage, and an output configured to output an amplified RF signal; and
    a bias controller configured, for each communications timeslot in a set of multiple consecutive communications timeslots, to:
        determine an average power level of an envelope of the RF input signal for a duration of the communications timeslot;
        compare the average power level of the envelope of the RF input signal to a first threshold; and
        supply a bias voltage to the bias input, wherein:
            when the average power level of the envelope of the RF input signal is greater than zero and does not exceed the first threshold, the bias controller supplies a substantially constant and non-zero bias voltage to the bias input for the duration of the communications timeslot, wherein the substantially constant and non-zero bias voltage is not modified for the duration of the communications timeslot; and
            when the average power level of the envelope of the RF input signal exceeds the first threshold, the bias controller supplies a non-constant bias voltage to the bias input for the duration of the communications timeslot, wherein the non-constant bias voltage tracks the envelope of the RF input signal over a duration of the communications timeslot.

2. The device of claim 1 wherein the bias controller is further configured to:
    select the substantially constant bias voltage supplied to the bias input to bias the RF amplifier in an optimal mode of operation for the communications timeslot; and
    supply the non-constant bias voltage to optimize a gain of the RF amplifier at power levels exceeding a high-power threshold during the communications timeslot.

3. The device of claim 1 wherein the RF amplifier is a first RF amplifier, wherein the device further includes a second RF amplifier having a second input configured to receive the RF input signal, a second bias input configured to receive a second bias voltage, and a second output configured to output a second amplified RF signal, wherein the bias controller is further configured to:
    supply a second bias voltage to the second bias input;
    compare the average power level of the RF envelope with a second threshold that is lower than the first threshold; and
    when the average power level exceeds the second threshold but is not greater than the first threshold, to limit variability in the second bias voltage over the duration of the communications timeslot.

4. The device of claim 3 wherein variability in the second bias voltage is limited by keeping the second bias voltage to within 10 percent of a target voltage.

5. The device of claim 3 wherein the bias controller is further configured, when the average power level of the envelope of the RF input signal exceeds the first threshold, to supply a non-constant bias voltage to both the first bias input and to the second bias input for the duration of the communications timeslot, wherein the non-constant bias voltage tracks the envelope of the RF input signal during the communications timeslot.

6. The device of claim 3 wherein the bias controller is further configured to:
   enable an operation of the first RF amplifier and inhibit the operation of the second RF amplifier when the average power level is not greater than the second threshold; and
   enable both the first RF amplifier and the second RF amplifier when the average power level exceeds the second threshold.

7. The device of claim 6 wherein the first RF amplifier is a first RF peaking amplifier, the second RF amplifier is a second RF peaking amplifier, and the device further includes:
   a third RF peaking amplifier having a third input configured to receive the RF input signal, a third bias input configured to receive a third bias voltage, and a third output configured to output a third amplified RF signal;
   a first modulation buffer, wherein the first modulation buffer is configured to provide modulated bias signals to the first and second RF peaking amplifiers; and
   a second modulation buffer, wherein the second modulation buffer is configured to provide a modulated bias signal to the third peaking amplifier.

8. A Doherty amplifier, comprising:
   a power splitter having a splitter input configured to receive an RF input signal, a carrier output configured to output a carrier input signal, and a peaking output configured to output a peaking input signal;
   an RF carrier amplifier having a carrier input configured to receive the carrier input signal, a carrier bias input configured to receive a carrier bias signal, and a carrier output configured to output an amplified carrier signal;
   an RF peaking amplifier having a peaking input configured to receive the peaking input signal, a peaking bias input configured to receive a peaking bias signal, and a peaking output configured to output an amplified peaking signal; and
   a bias controller configured to:
      determine an envelope of the RF input signal for a duration of a communications timeslot;
      compare an attribute of a power level of the envelope of the RF input signal to a first threshold;
      when the attribute of the power level of the envelope of the RF input signal is greater than zero and does not exceed the first threshold, supply a substantially constant and non-zero bias signal to the carrier bias input for a duration of the communications timeslot; and
      when the attribute of the power level of the envelope of the RF input signal exceeds the first threshold, supply a non-constant bias signal to the carrier bias input for the duration of the communications timeslot, wherein the non-constant bias signal is derived from the envelope of the RF input signal during the communications timeslot.

9. The Doherty amplifier of claim 8 wherein the attribute of the power level is an average power level of the RF envelope.

10. The Doherty amplifier of claim 8 wherein the non-constant bias signal is configured to track the envelope of the RF input signal to optimize a gain response of the RF carrier amplifier during the communications timeslot.

11. The Doherty amplifier of claim 8 wherein the bias controller is further configured:
   to compare the attribute of the power level of the RF envelope to a second threshold, wherein the second threshold is less than the first threshold; and
   when the attribute of the power level of the RF Input signal is less than second threshold, to inhibit an operation of the RF peaking amplifier.

12. The Doherty amplifier of claim 11 wherein the bias controller is further configured:
   to compare the attribute of the power level of the RF envelope to a third threshold, wherein the third threshold is less than the first threshold; and
   when the attribute of the power level of the RF Input signal is greater than the third threshold, supply a second substantially constant bias signal to the peaking bias input for the duration of the communications timeslot.

13. The Doherty amplifier of claim 12 wherein the third threshold is substantially the same as the second threshold.

14. The Doherty amplifier of claim 12 wherein the bias controller is further configured to, when the attribute of the power level of the RF input signal is greater than the first threshold, supply a second non-constant bias signal to the peaking bias input for the duration of the communications timeslot, wherein the second non-constant bias signal is derived from the envelope of the RF input signal during the communications timeslot.

15. The Doherty amplifier of claim 12 wherein:
   the RF peaking amplifier is a first RF peaking amplifier;
   the Doherty amplifier further includes a second RF peaking amplifier having a second peaking input configured to receive the peaking input signal, a second peaking bias input configured to receive a second peaking bias signal, and a second peaking output configured to output a second amplified peaking signal; and
   the bias controller is further configured to:
      enable the RF carrier amplifier and inhibit operation of the first and second RF peaking amplifiers when the power level does not exceed the third threshold; and
      enable the first and second RF peaking amplifiers when the power level exceeds the first threshold.

16. The Doherty amplifier of claim 15 wherein:
   the RF carrier amplifier is a first RF carrier amplifier;
   the Doherty amplifier further includes a second RF carrier amplifier having a second carrier input configured to receive the carrier input signal, a second carrier bias input configured to receive a carrier bias signal, and a second carrier output configured to output a second amplified carrier signal; and
   the bias controller is further configured to:
      enable at least one of the first and second RF carrier amplifiers, but inhibit operation of the first and second RF peaking amplifiers, when the power level is not greater than the third threshold; and
      enable both the first and second RF carrier amplifiers, and at least one of the first and second RF peaking amplifiers, when the power level exceeds the third threshold.

17. A method comprising:
   determining an envelope of an RF input signal to a Doherty amplifier for each communications timeslot of a set of multiple consecutive communications timeslots, the Doherty amplifier having an RF carrier amplifier and an RF peaking amplifier;
   comparing an attribute of a power level of the envelope of the RF input signal for a duration of a first timeslot in the set of multiple consecutive communications timeslots to a first threshold;
   when the attribute of the power level of the envelope of the RF input signal is greater than zero and does not exceed the first threshold, supplying a substantially constant and non-zero bias signal to a carrier bias input of the RF carrier amplifier for a duration of the communications timeslot; and when the attribute of the power level of the envelope of the RF input signal exceeds the first threshold, supplying a non-constant bias signal to the carrier bias input for the duration of the communications timeslot, wherein the non-constant bias signal is derived from the envelope of the RF input signal during the communications timeslot.

18. The method of claim 17 further comprising:

comparing the attribute of the power level of the RF envelope with a second threshold that is lower than the first threshold; and when the attribute of the power level exceeds the second threshold but is not greater than the first threshold, supplying a substantially constant bias signal both to the carrier bias input of the RF carrier amplifier and to a peaking bias input of the RF peaking amplifier over the duration of the communication timeslot.

19. The method of claim 18 further comprising:

enabling the RF carrier amplifier and inhibiting operation of the RF peaking amplifier when the power level is not greater than the second threshold; and enabling both the RF carrier amplifier and the RF peaking amplifier when the power level is greater than the second threshold.

20. The method of claim 19, wherein the Doherty amplifier further includes a second RF carrier amplifier and a second RF peaking amplifier, the method further comprising:

enabling at least one of the first and second RF carrier amplifiers, and inhibiting operation of both of the first and second RF peaking amplifiers, when the power level is not greater than the second threshold;

enabling both the first and second RF carrier amplifiers, and at least one of the first and second RF peaking amplifiers, when the power level exceeds the second threshold but is not greater than the first threshold; and enabling all of the first and second RF carrier amplifiers and the first and second RF peaking amplifiers when the power level exceeds the first threshold.

21. A packaged amplifier device, comprising:

first, second, and third leads;

a radio frequency (RF) amplifier having an input coupled to the first lead and configured to receive an RF input signal, a bias input configured to receive a bias voltage, and an output coupled to the second lead and configured to output an amplified RF signal; and a bias modulation circuit coupled to the third lead and to the bias input, wherein the bias modulation circuit is configured to receive a control signal indicating a magnitude of the bias voltage, and to supply the bias voltage to the bias input based on the control signal, wherein the control signal is derived from a power level of an envelope of the RF input signal during a communications timeslot, when the power level of the envelope of the RF input signal does not exceed a first threshold, the control signal causes the bias modulation circuit to supply a non-zero substantially constant bias voltage to the bias input for a duration of the communications timeslot, and when the power level of the envelope of the RF input signal exceeds the first threshold, the control signal causes the bias modulation circuit to supply a non-constant bias voltage to the bias input for the duration of the communications timeslot, wherein the non-constant bias voltage tracks the envelope of the RF input signal over the duration of the communications timeslot.

* * * * *